United States Patent [19]

Yu

[11] Patent Number: 6,146,963
[45] Date of Patent: Nov. 14, 2000

[54] METHODS FOR FORMING FERROELECTRIC CAPACITORS HAVING A BOTTOM ELECTRODE WITH DECREASED LEAKAGE CURRENT

[75] Inventor: Yong Sik Yu, Kyoungkido, Rep. of Korea

[73] Assignee: Hyundai Electronics Industries Co., Ltd., Rep. of Korea

[21] Appl. No.: 09/221,620

[22] Filed: Dec. 28, 1998

[30] Foreign Application Priority Data

Dec. 27, 1997 [KR] Rep. of Korea .............. 97-75086

[51] Int. Cl.$^7$ .................................. H01L 21/20
[52] U.S. Cl. .................................. 438/396; 438/396
[58] Field of Search ................ 438/3, 240, 393, 438/396, 255; 257/310, 295

[56] References Cited

U.S. PATENT DOCUMENTS

| | | |
|---|---|---|
| 5,254,217 | 10/1993 | Maniar et al. . |
| 5,358,889 | 10/1994 | Emesh et al. . |
| 5,407,855 | 4/1995 | Manair et al. . |
| 5,440,173 | 8/1995 | Evans, Jr. et al. ............ 257/751 |
| 5,466,629 | 11/1995 | Mahara et al. . |
| 5,491,102 | 2/1996 | Desu et al. ............ 437/52 |
| 5,510,651 | 4/1996 | Maniar et al. . |
| 5,519,235 | 5/1996 | Ramesh ............ 257/295 |
| 5,555,486 | 9/1996 | Kingon et al. . |
| 5,561,307 | 10/1996 | Mihara et al. . |
| 5,618,746 | 4/1997 | Hwang . |
| 5,619,393 | 4/1997 | Summerfelt et al. . |
| 5,739,049 | 4/1998 | Park et al. . |
| 5,780,886 | 7/1998 | Yamanobe ............ 257/295 |
| 5,824,590 | 10/1998 | New ............ 438/393 |
| 5,913,117 | 6/1999 | Lee ............ 438/240 |

FOREIGN PATENT DOCUMENTS

| | | |
|---|---|---|
| 7-50285 | 4/1995 | Japan . |
| 8-330538 | 12/1996 | Japan . |
| 9-260603 | 3/1997 | Japan . |
| 9-246214 | 9/1997 | Japan . |
| 9-283721 | 10/1997 | Japan . |
| 10-144884 | 5/1998 | Japan . |

Primary Examiner—David Nelms
Assistant Examiner—David Nhu
Attorney, Agent, or Firm—Blakely Sokoloff Taylor & Zafman

[57] ABSTRACT

Provided are methods for ferroelectric capacitors using a film of ruthenium dioxide as a bottom electrode. The method according to the invention includes the steps of: forming a first electrode of ruthenium dioxide over a lower layer including a conductive plug, the electrode being connected to the conductive plug; forming a film of strontium on the first electrode of ruthenium dioxide; forming a film of strontium ruthenium oxide by performing thermal treatment of the strontium film under oxygen atmosphere in order to prevent the diffusion of oxygen to the electrode of ruthenium dioxide; forming a thin film of crystallized ferroelectric material on the film of strontium ruthenium oxide; forming a second film of ruthenium dioxide on the ferroelectric film. The capacitor fabricated by the method according to the invention is enhanced in the characteristics about leakage current by the presence of the film of strontium ruthenium oxide as an oxygen diffusion barrier between the film of ruthenium dioxide as a bottom electrode and the ferroelectric film. The film of strontium ruthenium oxide prevents the diffusion of oxygen to the film of ruthenium dioxide when the ferroelectric film is crystallized by thermal treatment at high temperature under oxygen atmosphere.

9 Claims, 4 Drawing Sheets

METHODS FOR FORMING FERROELECTRIC CAPACITORS HAVING A BOTTOM ELECTRODE WITH DECREASED LEAKAGE CURRENT

FIELD OF THE INVENTION

The present invention relates to methods for fabricating semiconductor devices; and, particularly, to methods for forming ferroelectric capacitors which have a film of ruthenium dioxide ($RuO_2$) as a bottom electrode and is enhanced in characteristics about leakage current.

DESCRIPTION OF THE PRIOR ART

As well known, semiconductor memory elements having non-volatile characteristics use remanent polarization of ferroelectric materials which have two stable state of remanent polarization and dielectric constant of which is hundreds to thousands at room temperature in order to store information for a long time. A polycrystalline ferroelectric thin film of strontium bismuth tantalate (hereinafter, referred to as SBT) is chiefly used as the ferroelectric film.

The non-volatile memory element having the ferroelectric thin film uses the principle that if it is controlled to direct its polarization according to electric field and to input a signal, the digital signal 1 (high) or 0 (low) is stored in it by the direction of the remaining remanent polarization when the electric field is removed.

FIG. 1 shows the ferroelectric capacitor formed according to the prior art. Referring to this, described is the method for forming the ferroelectric capacitor in the prior art and its drawbacks.

First, after a transistor (not shown) is formed over a silicon substrate 11, an insulating film, for example, a $SiO_2$ film 12 is formed to insulate the transistor. The $SiO_2$ film 12 is then selectively etched to form a contact hole followed by burying polysilicon in the contact hole to form a polysilicon plug 13 connected to the source or drain region of the transistor. Films of Ti/TiN 14 are then formed as diffusion barriers and patterned, followed by forming a lower electrode 15, a SBT ferroelectric thin film 16, and an upper electrode 17, in turn, over the films of Ti/TiN 14 to form a capacitor.

In the ferroelectric capacitor formed to this structure, a film of ruthenium dioxide is generally used as a bottom electrode 15 of the SBT ferroelectric thin film 16. The ruthenium dioxide film shows better characteristics in the fatigue or loss of the polarization switching of the ferroelectric thin film due to electric cycling, compared with the other materials used as electrodes.

However, when the film of ruthenium dioxide is used as a bottom electrode, there are drawbacks that much leakage current is generated to decrease the element characteristics. This is caused from the fact that post-thermal treatment essentially processed at the time of forming the crystalline structure of the SBT ferroelectric thin film 16 is performed at high temperature under oxygen atmosphere. At this point among the processes, the active oxygen at high temperature is diffused to the lower and reacted with the ruthenium dioxide film. Accordingly, the ruthenium dioxide film either is oxidized to the poisonous gas state of $RuO_4$ or its surface becomes rough.

As described above, it is not appropriate to apply the prior technology to forming a ruthenium dioxide film as an excellent bottom electrode. Accordingly, it is required to develop the other methods for forming ferroelectric capacitors.

SUMMARY OF THE INVENTION

It is, therefore, an object of the present invention to provide methods for forming ferroelectric capacitors which can prevent decreasing characteristics about leakage current at the time of post-thermal treatment of the SBT ferroelectric thin film among the capacitor formation processes and, thus, minimize the generation of leakage current.

In accordance with one embodiment of the present invention, there is provided a method for forming a ferroelectric capacitor which comprises the steps of: forming a first electrode of ruthenium dioxide over a lower layer including a conductive plug, the electrode being connected to the conductive plug; forming a film of strontium on the first electrode of ruthenium dioxide; forming a film of strontium ruthenium oxide by performing thermal treatment of the strontium film under oxygen atmosphere in order to prevent the diffusion of oxygen to the electrode of ruthenium dioxide; forming a thin film of crystallized ferroelectric material on the film of strontium ruthenium oxide; forming a second film of ruthenium dioxide on the ferroelectric film.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

The invention will be illustrated in detail by the following preferred embodiments with reference to the accompanying drawings.

Figure 1:
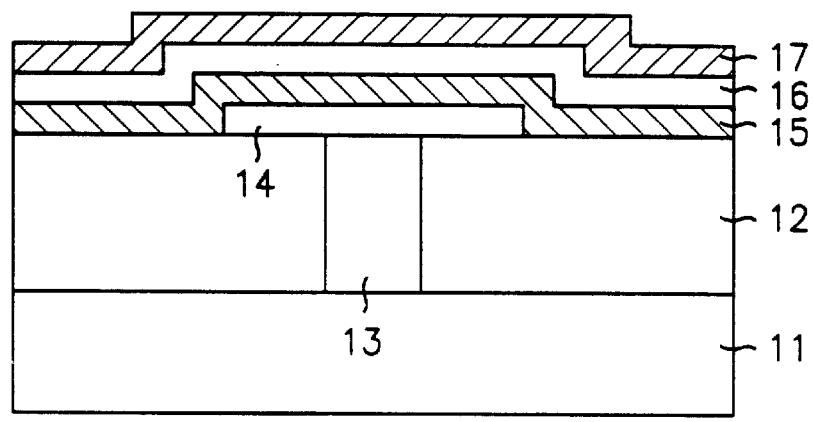
FIG. 1 shows the capacitor formed according to the prior art.
Figure 2A:
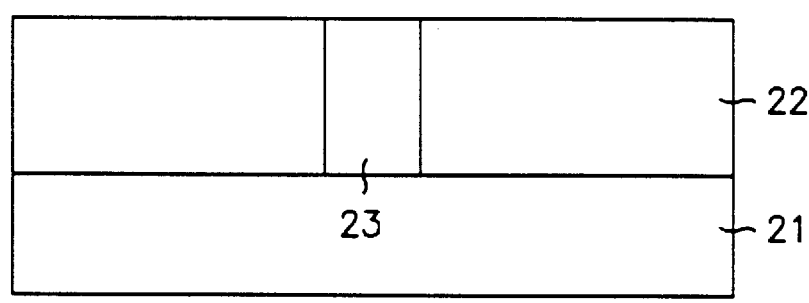
FIGS. 2a through 2i depict, schematically, various steps in the forming of the ferroelectric capacitor according to a preferred embodiment of the invention.

First, referring to FIG. 2a, after a transistor (not shown) is formed over a silicon substrate 21, an insulating film, i.e., a $SiO_2$ film 22 is formed to insulate the transistor, and the $SiO_2$ film 22 is then selectively etched to form a contact hole. At this point, the source or drain region of the transistor is exposed. Polysilicon is deposited to a thickness of about 500 to 3000 Å by chemical vapor deposition so as to be buried in the contact hole and a polysilicon plug 23 is formed by entirely etching the polysilicon film and remaining the polysilicon only in the contact hole. The polysilicon plug 23 is connected to the source or drain region of the transistor.

Figure 2B:
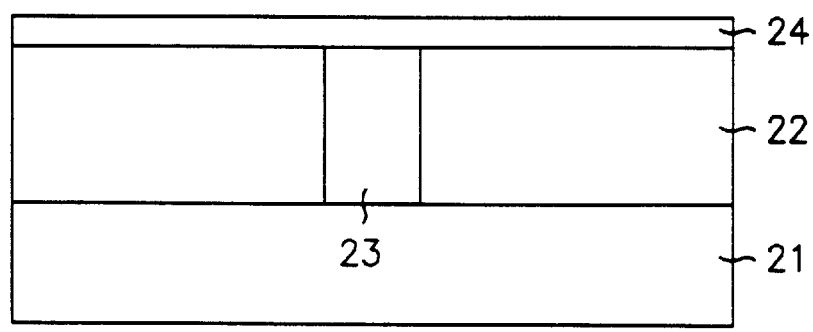
Figure 2C:
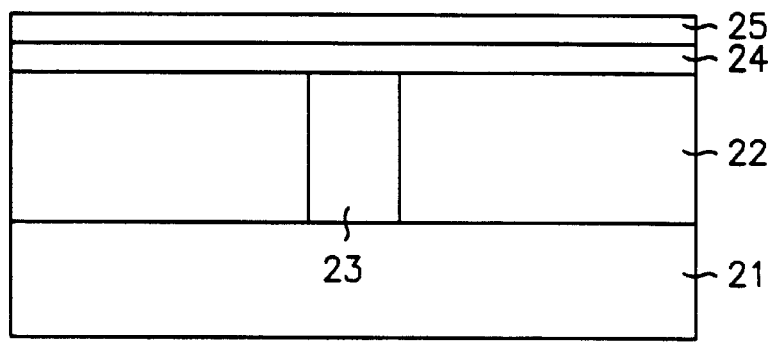

Next, referring to FIGS. 2b and 2c, a film of Ti 24 is deposited as a diffusion barrier to a thickness of about 100 to 1000 Å. A film of TiN 25 is then formed on the Ti film to a thickness of about 200 to 2000 Å. The Ti film 24 and TiN film 25 are formed as metal diffusion barriers between the polysilicon plug 23 and a bottom metal electrode which will be formed later as described below.

Figure 2D:
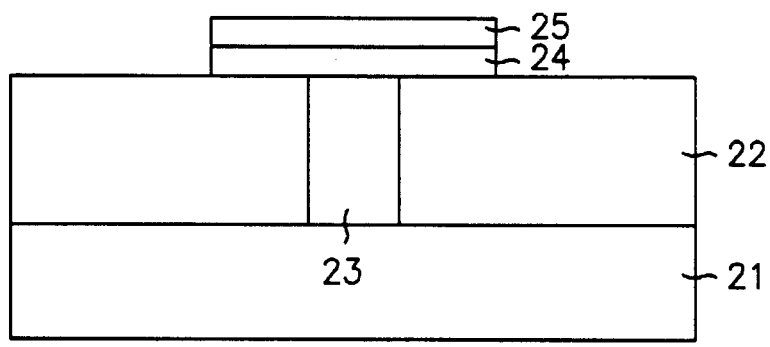
Figure 2E:
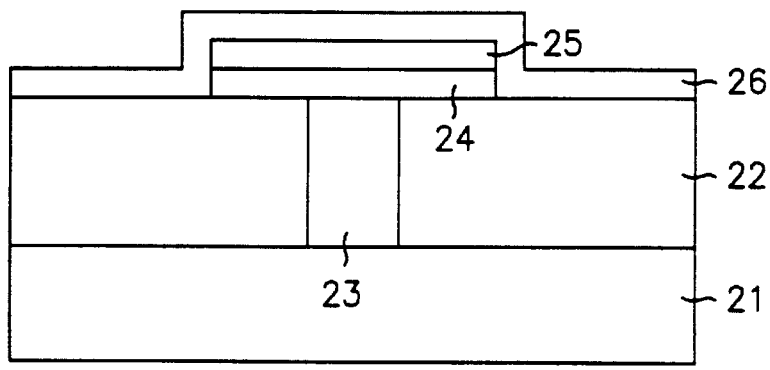

Next, referring to FIG. 2d, the Ti film 24 and the TiN film 25 are patterned and etched by photoresist and dry etching processes as known in the art to remain them only in the certain region overlapped with the polysilicon plug 23. Referring to FIG. 2e, a film of ruthenium 26 is deposited as an oxygen diffusion barrier over the entire structure to a thickness of about 100 to 1000 Å.

Figure 2F:
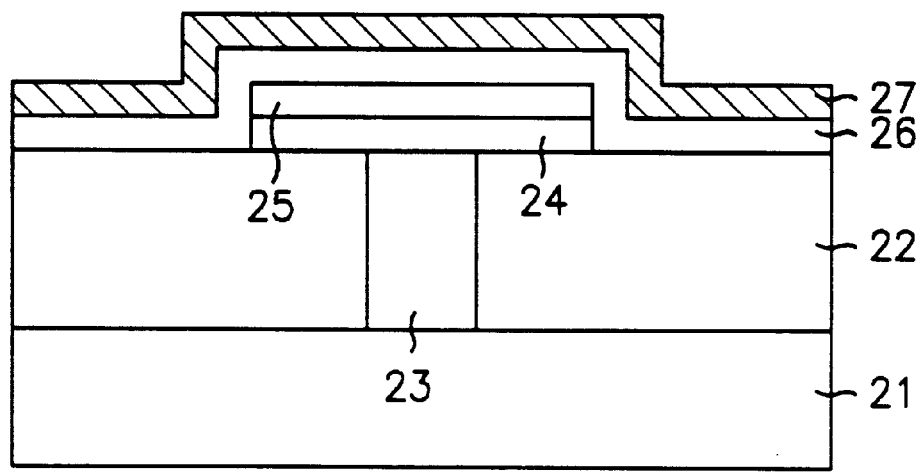

Next, referring to FIG. 2f, a film of ruthenium dioxide 27, which is conductive oxide, is deposited as a bottom electrode of a capacitor over the entire substrate to a thickness of about 500 to 5000 Å.

Figure 2G:
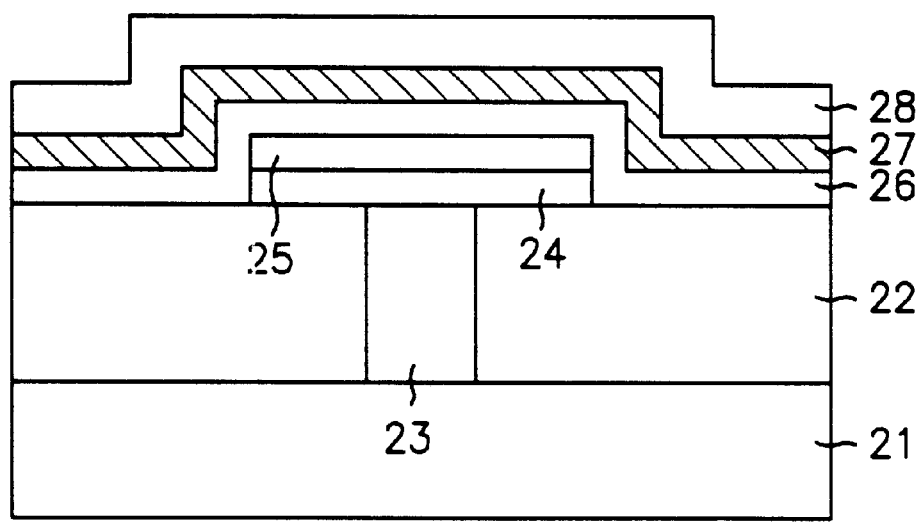

Next, referring to FIG. 2g, at this point among the processes, a film of strontium 28 is coated on the film of ruthenium dioxide 27 to a thickness of about 100 to 500 Å by spinning at 1500 to 3500 rpm for 10 to 30 seconds. This is different from the prior method in which a thin film of ferroelectric material is formed on the film of ruthenium dioxide at this point.

Figure 2H:
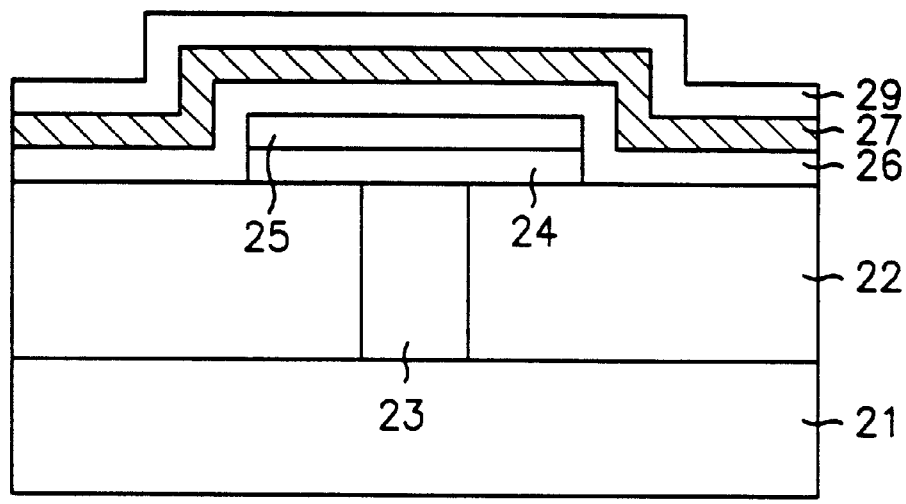

Next, referring to FIG. 2h, the film of strontium 28 coated on the film of ruthenium dioxide 27 is changed to a strontium ruthenium oxide ($SrRuO_3$) 29 by performing thermal treatment at a temperature of 400 to 800° C. under oxygen atmosphere. The film of strontium ruthenium oxide 29 is an oxygen diffusion barrier and will later prevent the film of ruthenium dioxide 27 from being oxidized at the time of thermal process of a ferroelectric film (described as below) at high temperature under oxygen atmosphere. This is suggested by the invention. Thus, the invention can sufficiently overcome the prior problems about leakage current in capacitors using the film of ruthenium dioxide as a bottom electrode 27 by forming the film of strontium ruthenium oxide 29 as an oxygen diffusion barrier.

Figure 2I:
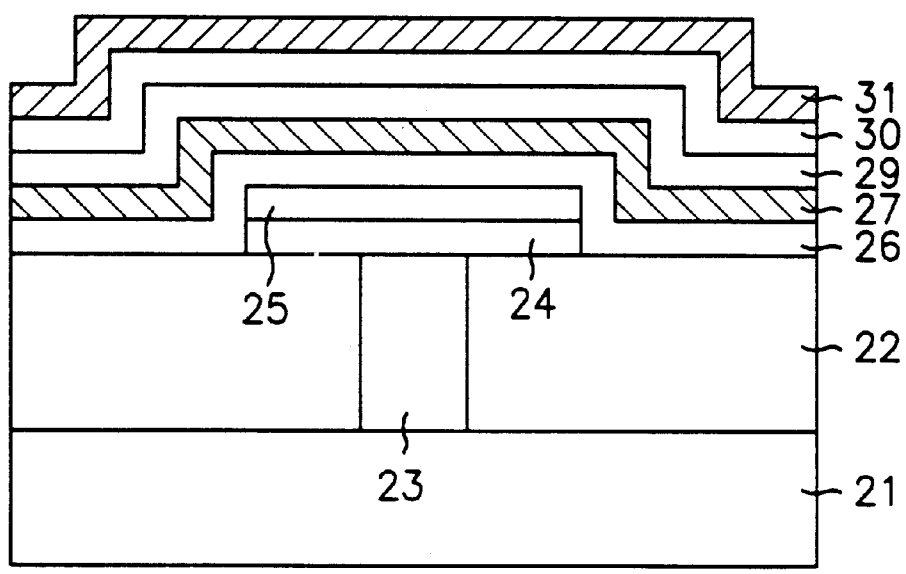

Finally, referring to FIG. 2i, a thin film of SBT ferroelectric material 30 is coated on the strontium ruthenium oxide 29 to a thickness of about 1000 to 5000 Å by spinning at 1500 to 3500 rpm for 10 to 30 seconds. It is then crystallized by performing thermal treatment at a high temperature of about 600 to 900° C. under oxygen atmosphere for 30 to 90 minutes. At the crystallization of the ferroelectric film, as the film of strontium ruthenium oxide also plays a role of seed to promote crystallization, the process conditions such as temperature and time can be reduced and the yield of the device can be enhanced. Subsequently, a film of ruthenium dioxide 31 is formed as an upper electrode to a thickness of about 500 to 2000 Å on the crystallized SBT ferroelectric film having high dielectric constant, thus to complete the formation of a capacitor.

In the above-described processes, the metal diffusion barrier film may be formed using films of tantalum/tantalum nitride instead of the films of Ti/TiN. The ruthenium film 26 may be also directly deposited on the polysilicon plug 23 without the formation of the metal diffusion barrier films.

While the present invention has been described with respect to certain preferred embodiments only, other modifications and variations may be made without departing from the spirit and scope of the present invention as set forth in the following claims.

What is claimed is:

1. A method for forming ferroelectric capacitor comprising the steps of:
    forming a first electrode of ruthenium dioxide over a lower layer including a conductive plug, the electrode being connected to the conductive plug;
    forming a film of strontium on the first electrode of ruthenium dioxide;
    forming a film of strontium ruthenium oxide by performing thermal treatment of the strontium film under oxygen atmosphere in order to prevent diffusion of oxygen to the electrode of ruthenium dioxide;
    forming a thin film of crystallized ferroelectric material on the film of strontium ruthenium oxide;
    forming a second film of ruthenium dioxide on the ferroelectric film.

2. The method according to claim 1, wherein before forming the first electrode of ruthenium dioxide, the method further comprises the steps of:
    forming a film of diffusion barrier over the lower layer including the conductive plug, the film of diffusion barrier being overlapped with the conductive plug;
    forming a film of ruthenium on the film of diffusion barrier in order to prevent diffusion of oxygen to the conductive plug.

3. The method according to claim 1, wherein the conductive plug is a polysilicon plug.

4. The method according to claim 2, wherein the conductive plug is a polysilicon plug.

5. The method according to claim 1, wherein the thickness of the strontium film is in a range of 50 to 500 Å.

6. The method according to claim 1, wherein the thermal treatment of the strontium film is performed at a temperature of 400 to 800° C.

7. The method according to claim 1, wherein the thin film of crystallized ferroelectric material is formed at a temperature of 600 to 900° C.

8. The method according to claim 2, wherein the films of diffusion barrier are composed of a film of titanium and a film of titanium nitride, or a film of tantalum and a film of tantalum nitride.

9. The method according to claim 2, wherein the thickness of the ruthenium film is in a range of 100 to 1000 Å.

* * * * *